United States Patent
Tsai et al.

(10) Patent No.: US 6,841,313 B2
(45) Date of Patent: Jan. 11, 2005

(54) PHOTOMASK WITH DIES RELATING TO DIFFERENT FUNCTIONALITIES

(75) Inventors: Fei-Gwo Tsai, Hsin-Chu (TW); Yeou-Hsin Hsieh, Tainan (TW); Chih-Chiang Tu, Tauyen (TW); Yu-Chin King, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 202 days.

(21) Appl. No.: 10/160,453

(22) Filed: May 31, 2002

(65) Prior Publication Data

US 2003/0224148 A1 Dec. 4, 2003

(51) Int. Cl.$^7$ ................................................. G03F 9/00
(52) U.S. Cl. ................................................................ 430/5
(58) Field of Search .................................. 430/5; 378/34, 378/35

(56) References Cited

U.S. PATENT DOCUMENTS 6,680,150 B2 * 1/2004 Blatchford et al. ............ 430/5

* cited by examiner

*Primary Examiner*—Saleha R. Mohamedulla
(74) *Attorney, Agent, or Firm*—Tung & Associates

(57) ABSTRACT

A photomask having dies relating to different functionalities is disclosed. A photomask for performing lithography in conjunction with fabrication of one or more semiconductor devices includes one or more first semiconductor dies and one or more second semiconductor dies. Each first semiconductor die relates to first functionality having a first definition grade. Each second semiconductor die relates to second functionality different than the first functionality. The second functionality has a second definition grade at least substantially close to the first definition grade. For instance, the second definition grade may be identical to the first definition grade, or it may be immediately adjacent (i.e., sequentially related) to the first definition grade.

15 Claims, 3 Drawing Sheets

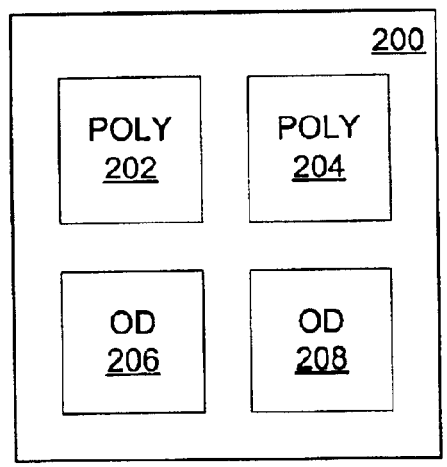
FIG 2A
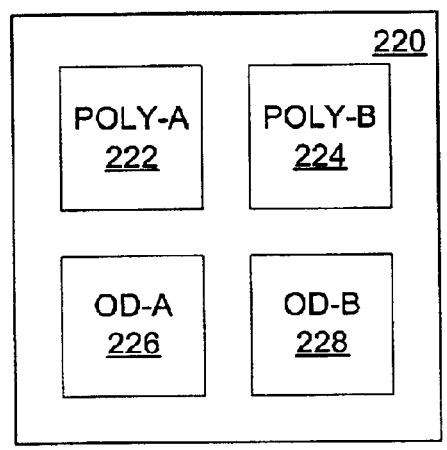
FIG 2B
FIG 2C
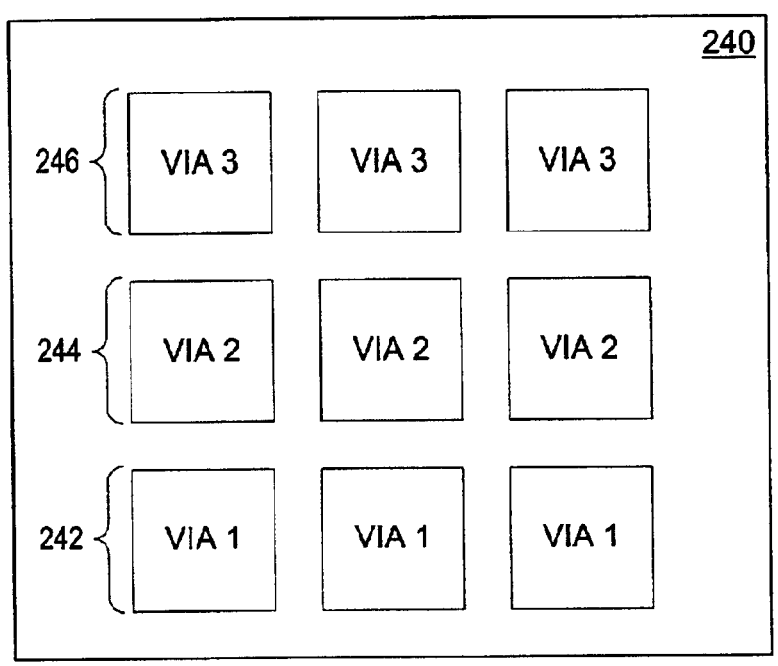

| FUNCTIONALITY | GRADE |
|---|---|
| OD, Poly | I |
| PW-1, PW-2 | E |
| NW-1, NW-2 | E |
| PLDD-1, NLDD-1, PLDD-2 | F |
| NLDD-2, P+S/D, N+S/D | F |
| ODR, OD2, ESD | D |
| Contact, m1 | I |
| Via 1, Via 2, Via 3 | H-PSM |
| M2, M3, M4 | G |
| M5, M6, M7 | G |
| Via 4, Via 5, Via 6 | H-PSM |
| PRO, Via 7, M8 | E |
FIG 3
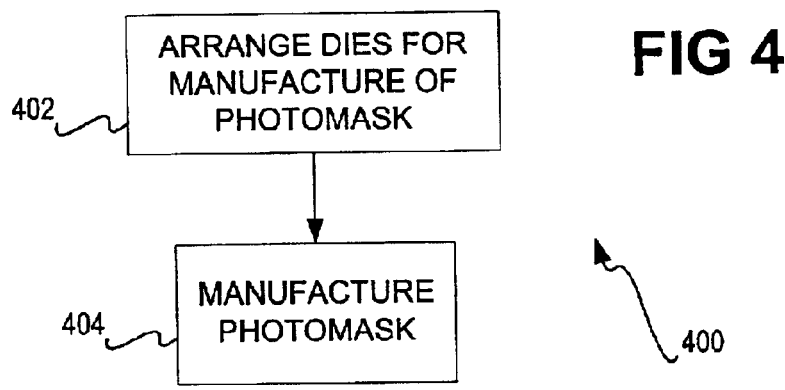
FIG 4
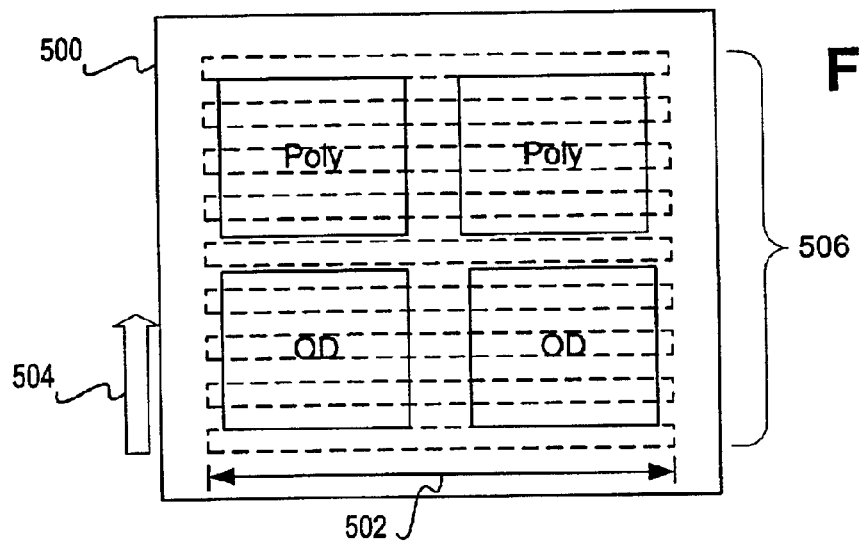
FIG 5

PHOTOMASK WITH DIES RELATING TO DIFFERENT FUNCTIONALITIES

FIELD OF THE INVENTION

This invention relates generally to semiconductor processing, and more particularly to photomasks used in such semiconductor processing, such as those used in photolithography.

BACKGROUND OF THE INVENTION

There are four basic operations in semiconductor processing, layering, patterning, doping, and heat treatments. Layering is the operation used to add thin layers to the surface of a semiconductor wafer. Patterning is the series of steps that results in the removal of selected portions of the layers added in layering. Doping is the process that puts specific amounts of dopants in the wafer surface through openings in the surface layers. Finally, heat treatments are the operations in which the wafer is heated and cooled to achieve specific results, where no additional material is added or removed from the wafer.

Of these four basic operations, patterning is typically the most critical. The patterning operation creates the surface parts of the devices that make up a circuit on the semiconductor wafer. The operation sets the critical dimensions of these devices. Errors during patterning can cause distorted or misplaced defects that result in changes in the electrical function of the device, as well as device defects.

The patterning process is also known by the terms photomasking, masking, photolithography, and microlithography. The process is a multi-step process similar to photography or stenciling. The required pattern is first formed in photomasks and transferred into the surface layers of the semiconductor wafer. A mask is precisely aligned over the wafer and the photoresist. This causes the exposure of the photoresist, except for the part that was masked by the photomask. The unexposed photoresist is then removed.

A given photomask may have a number of dies of the same semiconductor layout or design, or may have a number of dies of different layouts of design. However, regardless of the number or type of dies on a photomask, generally for a given photomask all the dies are for performing the same functionality. For instance, all the dies on the mask may relate to being an oxide deposition mask, a polysilicon mask, an implant mask, and so on.

FIGS. 1A–1C show sample masks according to the prior art that illustrate this limitation. In FIG. 1A, the photomask 100 has separate dies 102, 104, 106, and 108. The dies 102, 104, 106, and 108 may be for the same semiconductor device or for different semiconductor devices. However, all of the dies 102, 104, 106, and 108 relate to performing lithography with respect to the same functionality, specifically with respect to polysilicon. Similarly, in FIG. 1B, the photomask 150 has separate dies 152, 154, 156, and 158, which may be for the same semiconductor device or for different semiconductor devices. Again, however, all of the dies 152, 154, 156, and 158 relate to performing lithography with respect to the same functionality, specifically with respect to oxide deposition (OD). Finally, in FIG. 1C, the dies of the photomask 170 relate to performing lithography with respect to the same functionality, specifically with respect to via holes, or "vias," as to the same metallization layer, metallic layer one.

Moreover, since the invention of the integrated circuit (IC), semiconductor chip features have become exponentially smaller and the number of transistors per device exponentially larger. Advanced IC's with hundreds of millions of transistors at feature sizes of 0.13 micron, 0.10 micron, and less are becoming routine. Improvement in overlay tolerances in optical photolithography, and the introduction of new light sources with progressively shorter wavelengths, have allowed optical steppers to significantly reduce the resolution limit for semiconductor fabrication far beyond one micron.

The reduction in feature size makes for fabrication photomasks a more difficult and expensive process. The cost of making such masks, in fact, can become a significant problem in product and technology development of semiconductor fabrication. In particular, because there usually must be one mask for each type of semiconductor operation or functionality to be performed, a great number of masks may have to be manufactured to completely fabricate a desired semiconductor device, which adds to the fabrication cost of the semiconductor device.

Therefore, there is a need for reducing the number of masks needed to fabricate one or more desired semiconductor devices. Such mask reduction should be able to be employed in conjunction with devices having small feature sizes. For these and other reasons, there is a need for the present invention.

SUMMARY OF THE INVENTION

The invention relates to a photomask having dies relating to different functionalities. A photomask for performing lithography in conjunction with fabrication of one or more semiconductor devices includes one or more first semiconductor dies and one or more second semiconductor dies. Each first semiconductor die relates to first functionality having a first definition grade. Each second semiconductor die relates to second functionality different than the first functionality. The second functionality has a second definition grade at least substantially close to the first definition grade. For instance, the second definition grade may be identical to the first definition grade, or it may be immediately adjacent (i.e., sequentially related) to the first definition grade.

The invention provides for advantages over the prior art. A given photomask can be used for different functionalities. A functionality is generally defined herein as a typically lithographic operation or function pertaining to a particular semiconductor process. Examples include a polysilicon-related functionality, which is a photolithographic operation performed for patterning polysilicon. Similarly, an oxide deposition (OD)-related functionality is an operation for patterning for the purpose of OD. Other examples of functionalities include those related to contacts, vias, metallization, and so on, as can be appreciated by those of ordinary skill within the art. Thus, a photomask having dies for two different functionalities can be used for two different operations, such as photolithography of polysilicon, as well as photolithography for OD. Such a photomask is also referred to as a multi-layered mask.

Having a photomask that can be used for different functionalities allows for a reduction in the number of masks necessary to fabricate a semiconductor device or devices, which reduces cost. Cycle time in number of days to manufacture or fabricate the photomasks is also reduced. Furthermore, semiconductor foundry customers have an alternative to cyber-shuttle service, in which a number of different customers' dies are included on a given photomask for the same functionality. Rather, a single customer's dies can be put on the same photomask, even where the dies relate to different functionalities. Other advantages, embodiments, and aspects of the invention will become apparent by reading the detailed description that follows, and by referencing the attached drawings.

BRIEF DESCRIPTION OF THE DRAWINGS

FIGS. 2A, 2B, and 2C are diagrams of sample photomasks according to varying embodiments of the invention, where each photomask has dies for performing different functionalities.

FIG. 3 is a table showing the definition grades of different lithography-related functionalities, according to an embodiment of the invention.

FIG. 4 is a flowchart of a method for manufacturing a photomask according to an embodiment of the invention.

FIG. 5 is a diagram illustrating the stepping and/or scanning process that can be employed to manufacture a photomask according to an embodiment of the invention.

DETAILED DESCRIPTION OF THE INVENTION

Figure 1A:
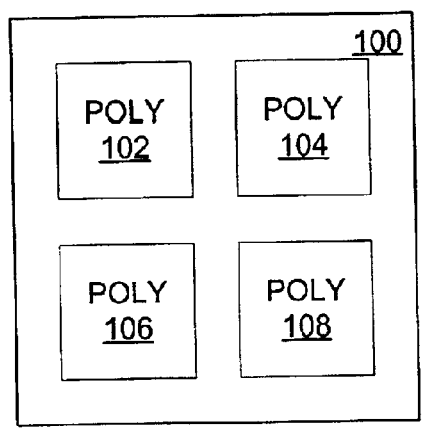
FIGS. 1A, 1B, and 1C are diagrams of sample photomasks according to the prior art, where each photomask has dies for performing the same functionality.
Figure 1B:
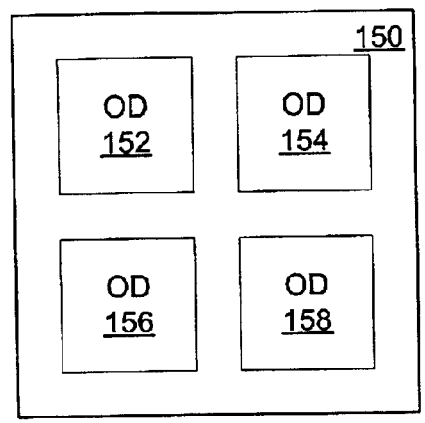
Figure 1C:
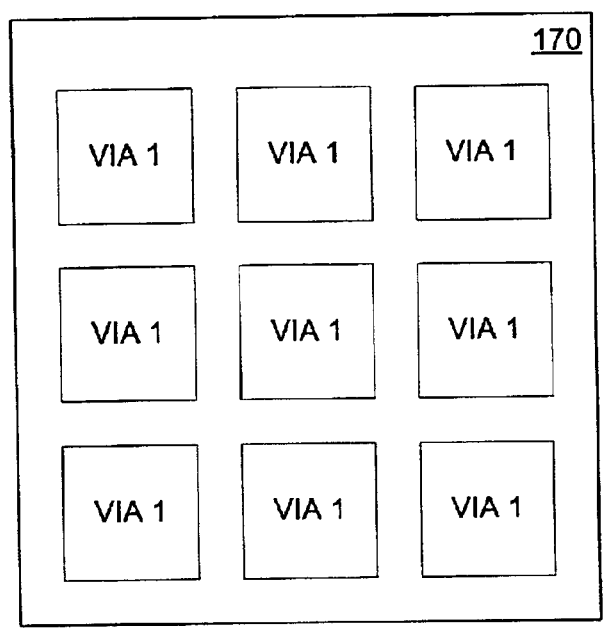

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

FIGS. 2A, 2B, and 2C show example photomasks 200, 220, and 240, respectively, according to varying embodiments of the invention. Each of these photomasks has semiconductor dies with different functionalities. In FIG. 2A, the photomask 200 has polysilicon functionality-related dies 202 and 204, and also oxide deposition (OD)-related dies 206 and 208. This means that the same photomask 200 can be used for purposes of performing two different operations or functionalities: polysilicon-related photolithography, as well as OD-related photolithography.

Similarly, in FIG. 2B, the photomask 220 has a polysilicon functionality-related die 222 for a first polysilicon layer, and a polysilicon functionality-related die 224 for a second polysilicon layer. The different polysilicon layers are encompassed within the definition of different functionalities. The mask 220 also has an OD functionality-related die 226 for a first OD layer, and an OD functionality-related die 228 for a second OD layer. In FIG. 2C, the photomask 240 has dies 242 for via functionality for a first via layer, dies 244 for via functionality for a second via layer, and dies 246 for via functionality for a third via layer. The different via layers are also encompassed within the definition of different functionalities.

Preferably, the different functionalities of the dies have at least substantially close definition grades. A definition grade relates to the resolution or definition required for proper lithography for a given functionality. A grade "A," for instance, has lower resolution or definition than a grade "B," and so on. In one embodiment of the invention, at least substantially close definition grades can mean that the definition grades of different functionalities are identical, or that the definition grades of different functionalities are immediately adjacent (i.e., immediately sequentially related). For example, dies with two different functionalities may nevertheless both have the same definition grade of "B." As another example, dies with two different functionalities may have either a definition grade of "E" and "F," which are immediately adjacent to one another.

FIG. 3 shows a table 300 of the grades for different functionalities, according to an embodiment of the invention. The table 300 includes a column 302 identifying different functionalities according to acronyms readily understood by those of ordinary skill within the art, and a column 304 identifying the corresponding definition grades for these different functionalities. Thus, OD and polysilicon-related photolithographic functionalities both have a grade of "I." As a result, dies for such functionalities may be included on the same photomask as dies for functionalities such as contact and metallization layer one (M1)-related photolithographic functionalities, which also both have a grade of "I." Similarly, dies for OD and polysilicon-related photolithographic functionalities may be included on the same photomask as dies for functionalities such as vias layers one through three or four through six, which have a grade of "H" when used with a phase-shift mask (PSM).

Thus, a photomask according to an embodiment of the invention may have a number of different groups of dies, such as one, two, three, or more such groups of dies. Each die group relates to a given functionality and has a given definition grade. Whereas the functionalities of the die groups may be different, and preferably are, the definition grades of the die groups are at least substantially close to one another, such as being identical or being immediately adjacent to one another. Semiconductor devices can then be fabricated at least in part by employing photolithography that uses such a photomask according to an embodiment of the invention.

FIG. 4 shows a method 400 for manufacturing a photomask, according to an embodiment of the invention. First, the dies to be put on the photomask are arranged for placement thereon (402). At least one of the dies has a different functionality than the other of the dies, where the different functionalities of the dies nevertheless have definition grades that are at least substantially close to one another, as have been described. Next, the photomask is actually made, with the dies as have been arranged (404). For instance, this may employ a scanning and/or stepping process that scans the photomask in a line-by-line manner in accordance with the desired arranged dies.

FIG. 5 shows an example of such a scanning and/or stepping process that can be used to manufacture a photomask in 404 of FIG. 4, according to an embodiment of the invention. On the photomask 500 there are two polysilicon-related functionality dies and two OD-related functionality dies. Scanning is accomplished from left to right or right to left across a scan length 502. Scanning starts at the bottom of the photomask 500, and proceeds upward on a line-by-line basis, as indicated by the arrow 504. In this way, the photomask 500 is scanned by employing a series of horizontal lines 506, as can be appreciated by those of ordinary skill within the art.

What is described next is a mask-tooling rule for a multi-semiconductor device tape-in, according to an embodiment of the invention. The mask-tooling rule is described mathematically. The objective is to minimize the cost:

$$Z=x((1+Q_s)\Sigma co_i+y(R_m C_n COM_j)). \quad (1)$$

This objective is subject to the following constraints:

$$x+y=1; \; x*y=0;$$

and, $$\text{if}(1+Q_S)\Sigma co_i > R_m C_n COM_j \text{ then } x=0, \text{ else } x=1. \quad (2)$$

The variables and constants in equation (1) and constraints (2) are as follows. $Q_s$ indicates the device number selected for mass production, where as $co_i$ indicates the cost of a certain layer i. $R_m$ is the tape-in with m rows, where as $C_n$ is the tape-in with n columns. $COM_j$ is the jth-type full set cost using a merged layers approach. Finally, $R_m*C_n-Q_s$ is greater than or equal to zero.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A photomask for performing lithography in conjunction with fabrication of one or more semiconductor devices comprising:
    at least one first semiconductor die, each first semiconductor die relating to first functionality having a first definition grade, the first functionality being a lithographic operation pertaining to a first type of semiconductor process;
    at least one second semiconductor die, each second semiconductor die relating to second functionality different than the first functionality and having a second definition grade at least substantially close to the first definition grade, the second functionality being a lithographic operation pertaining to a second type of semiconductor process different than the first type of semiconductor process.

2. The photomask of claim 1, wherein the second definition grade is identical to the first definition grade.

3. The photomask of claim 1, wherein the second definition grade is immediately sequentially related to the first definition grade.

4. The photomask of claim 1, further comprising at least one third semiconductor die, each third semiconductor die relating to third functionality different than the first and the second functionalities and having a third definition grade at least substantially close to the first and the second definition grades.

5. The photomask of claim 4, wherein the third definition grade is identical to at least one of the first and the second definition grades.

6. The photomask of claim 1, wherein the first and the second functionalities is each differently selected from the group of functionalities essentially consisting of: polysilicon-related functionality, oxide deposition (OD)-related functionality, contact-related functionality, and metallization-related functionality.

7. The photomask of claim 6, wherein the group of functionalities further essentially consists of via-related functionality.

8. A method comprising:
    arranging a plurality of dies for manufacture of a photomask, at least one die having a different functionality than a functionality of other of the plurality of dies, the different functionality of the at least one die having a definition grade at least substantially close to a definition grade of the other of the plurality of dies, the different functionality being a lithographic operation pertaining to a type of semiconductor process different than a type of semiconductor process of the functionality of the other of the plurality of dies; and,
    manufacturing the photomask having the plurality of dies as have been arranged.

9. The method of claim 8, wherein manufacturing the photomas comprises employing a scanning process scanning the photomask in a line-by-line manner.

10. The method of claim 8, wherein the definition grade of the at least one die is identical to the definition grade of the other of the plurality of dies.

11. The method of claim 8, wherein the definition grade of the at least one die is immediately sequentially related to the definition grade of the other of the plurality of dies.

12. The method of claim 8, wherein arranging the plurality of dies further comprises at least one additional die having an additional functionality unlike the different functionality of the at least one die and the functionality of the other of the plurality of dies, the at least one additional die having a definition grade substantially close to the definition grade of the at least one die and the definition grade of the other of the plurality of dies.

13. The method of claim 12, wherein the definition grade of the at least one additional die is identical to at least one of the definition grade of the at least on die and the definition grade of the other of the plurality of dies.

14. The method of claim 8, wherein the different functionality of the at least one die and the functionality of the other of the plurality of dies are differently selected from the group of functionalities essentially consisting of: polysilicon-related functionality, oxide deposition (OD)-related functionality, contact-related functionality, and metallization-related functionality.

15. The method of claim 14, wherein the group of functionalities further essentially consists of via-related functionality.

* * * * *